(12) United States Patent
Yokogawa et al.

(10) Patent No.: US 8,890,175 B2
(45) Date of Patent: Nov. 18, 2014

(54) NITRIDE-BASED SEMICONDUCTOR ELEMENT AND METHOD FOR FABRICATING THE SAME

(71) Applicant: Panasonic Corporation, Osaka (JP)

(72) Inventors: Toshiya Yokogawa, Nara (JP); Naomi Anzue, Osaka (JP); Akira Inoue, Osaka (JP); Ryou Kato, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/799,973

(22) Filed: Mar. 13, 2013

(65) Prior Publication Data

US 2013/0270574 A1 Oct. 17, 2013

Related U.S. Application Data

(63) Continuation of application No. PCT/JP2012/002268, filed on Apr. 2, 2012.

(30) Foreign Application Priority Data

Apr. 8, 2011 (JP) .................................. 2011-086505

(51) Int. Cl.
| | | |
|---|---|---|
| *H01L 27/15* | (2006.01) | |
| *H01L 33/32* | (2010.01) | |
| *H01L 33/40* | (2010.01) | |
| *H01L 21/02* | (2006.01) | |
| *H01L 29/04* | (2006.01) | |
| *H01L 33/16* | (2010.01) | |

(52) U.S. Cl.
CPC ................. *H01L 33/32* (2013.01); *H01L 33/40* (2013.01); *H01L 21/02389* (2013.01); *H01L 21/0254* (2013.01); *H01L 21/02579* (2013.01); *H01L 21/0262* (2013.01); *H01L 21/02458* (2013.01); *H01L 21/02581* (2013.01); *H01L 29/045* (2013.01); *H01L 33/16* (2013.01); *H01L 2933/0016* (2013.01)
USPC .................. 257/79; 257/13; 257/94; 257/103

(58) Field of Classification Search
USPC ..................................................... 257/79–103
See application file for complete search history.

(56) References Cited

U.S. PATENT DOCUMENTS 5,990,500 A * 11/1999 Okazaki .......................... 257/99
6,067,309 A * 5/2000 Onomura et al. .......... 372/46.01
(Continued)

FOREIGN PATENT DOCUMENTS

| JP | 10-154829 A | 6/1998 |
|---|---|---|
| JP | 2000-164512 A | 6/2000 |

(Continued)

OTHER PUBLICATIONS

International Search Report for corresponding International Application No. PCT/JP2012/002268 mailed May 29, 2012.
(Continued)

*Primary Examiner* — Matthew W Such
*Assistant Examiner* — Frederick B Hargrove
(74) *Attorney, Agent, or Firm* — Renner, Otto, Boisselle & Sklar, LLP

(57) ABSTRACT

A nitride-based semiconductor element according to an embodiment of the present disclosure includes: a p-type contact layer, of which the growing plane is an m plane; and an electrode which is arranged on the growing plane of the p-type contact layer. The p-type contact layer is a GaN-based semiconductor layer which has a thickness of 26 nm to 60 nm and which includes oxygen at a concentration that is equal to or higher than Mg concentration of the p-type contact layer. In the p-type contact layer, the number of Ga vacancies is larger than the number of N vacancies.

37 Claims, 10 Drawing Sheets

(56) References Cited

U.S. PATENT DOCUMENTS

| | | |
|---|---|---|
| 2008/0048195 A1 | 2/2008 | Okuyama et al. |
| 2009/0114933 A1* | 5/2009 | Osawa et al. ............... 257/96 |
| 2010/0096615 A1* | 4/2010 | Okamoto et al. ............ 257/13 |
| 2010/0230690 A1 | 9/2010 | Kyono et al. |
| 2011/0037088 A1 | 2/2011 | Oya et al. |
| 2011/0156048 A1 | 6/2011 | Yokogawa et al. |
| 2011/0284905 A1* | 11/2011 | Yokogawa et al. ........... 257/98 |

FOREIGN PATENT DOCUMENTS

| | | |
|---|---|---|
| JP | 2000-164922 A | 6/2000 |
| JP | 2001-308462 A | 11/2001 |
| JP | 2003-332697 A | 11/2003 |
| JP | 2005-203604 A | 7/2005 |
| JP | 2006-024713 A | 1/2006 |
| JP | 2009-170604 A | 7/2009 |
| JP | 4568379 B | 8/2010 |
| WO | 2010/052810 A1 | 5/2010 |
| WO | WO2010052810 * | 5/2010 |
| WO | 2010/113405 A1 | 10/2010 |

OTHER PUBLICATIONS

International Preliminary Report on Patentability for corresponding International Application No. PCT/JP2012/002268 dated Nov. 13, 2012.

* cited by examiner

● N
◒ Ga

SAMPLE No.1

$3.7 \times 10^{-2} \, (\Omega \, cm^2)$

SAMPLE No.2

$7.1 \times 10^{-3} \, (\Omega \, cm^2)$

SAMPLE No.3

$2.0 \times 10^{-3} \, (\Omega \, cm^2)$

SAMPLE No.4

$1.6 \times 10^{-3} (\Omega cm^2)$

SAMPLE No.5

$1.1 \times 10^{-3} (\Omega cm^2)$

NITRIDE-BASED SEMICONDUCTOR ELEMENT AND METHOD FOR FABRICATING THE SAME

This is a continuation of International Application No. PCT/JP2012/002268, with an international filing date of Apr. 2, 2012, which claims priority of Japanese Patent Application No. 2011-086505, filed on Apr. 8, 2011, the contents of which are hereby incorporated by reference.

BACKGROUND

1. Technical Field

The present application relates to a nitride-based semiconductor element and a method for fabricating such an element.

2. Description of the Related Art

A nitride semiconductor including nitrogen (N) as a Group V element is a prime candidate for a material to make a short-wave light-emitting element, because its bandgap is sufficiently wide. Among other things, gallium nitride-based compound semiconductors (which will be referred to herein as "GaN-based semiconductors") have been researched and developed particularly extensively. As a result, blue-ray-emitting light-emitting diodes (LEDs), green-ray-emitting LEDs and semiconductor laser diodes made of GaN-based semiconductors have already been used in actual products (see Japanese Laid-Open Patent Publication No. 2001-308462 and Japanese Laid-Open Patent Publication No. 2003-332697, for example). A nitride-based semiconductor such as a GaN-based semiconductor ($Al_xGa_yIn_zN$ (where $0 \leq x$, $0 \leq y$, $0 \leq z$ and $x+y+z=1$)) has a wurtzite crystal structure. FIG. 1 schematically illustrates a unit cell of GaN. In an $Al_xGa_yIn_zN$ (where $0 \leq x$, $0 \leq y$, $0 \leq z$, and $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c axis". A plane that intersects with the c axis at right angles is called either a "c plane" or a "(0001) plane". It should be noted that the "c axis" and the "c plane" are sometimes referred to as "C axis" and "C plane".

In fabricating a semiconductor element using GaN-based semiconductors, a c-plane substrate, i.e., a substrate of which the principal surface is a (0001) plane, is used as a substrate on which GaN-based semiconductor crystals will be grown. In a c plane, however, there is a slight shift in the c-axis direction between a Ga atom layer and a nitrogen atom layer to produce electrical polarization there. That is why the c plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer due to the quantum confinement Stark effect of carriers, and the internal quantum efficiency decreases. As a result, a threshold current increases in a semiconductor laser diode and power dissipation increases and luminous efficiency decreases in an LED. Meanwhile, as the density of injected carriers increases, the piezoelectric field is screened and the emission wavelength varies, too.

Thus, to overcome these problems, it has been proposed that a substrate, of which the principal surface is a non-polar plane such as a (10-10) plane that is perpendicular to the [10-10] direction and that is called an "m plane", be used. In this case, "−" attached on the left-hand side of a Miller-Bravais index in the parentheses means a "bar" (a negative direction index). As shown in FIG. 2, the m plane is parallel to the c axis (i.e., the primitive vector c) and intersects with the c plane at right angles. On the m plane, Ga atoms and nitrogen atoms are on the same atomic plane. For that reason, no electrical polarization will be produced perpendicularly to the m plane. That is why if a semiconductor multilayer structure is formed perpendicularly to the m plane, no piezoelectric field will be generated in the active layer, either. As a result, the problems described above can be overcome.

In this case, the "m plane" is a generic term that collectively refers to a family of planes including (10-10), (−1010), (1-100), (−1100), (01-10) and (0-110) planes. In this description, the "X-plane growth" means epitaxial growth that is produced perpendicularly to the X plane (where X=c or m, for example) of a hexagonal wurtzite structure. As for the X-plane growth, the X plane will be sometimes referred to herein as a "growing plane". Furthermore, a layer of semiconductor crystals that have been formed as a result of the X-plane growth will be sometimes referred to herein as an "X-plane semiconductor layer". And a nitride-based semiconductor element including a semiconductor layer, of which the growing plane is an X plane, will be sometimes simply referred to herein as an "X-plane semiconductor element".

PCT International Application Publication No. 2010/113405 and PCT International Application Publication No. 2010/052810 relate to reducing the contact resistance of an m-plane semiconductor element. The entire disclosures of PCT International Application Publication No. 2010/113405 and PCT International Application Publication No. 2010/052810 are hereby incorporated by reference.

SUMMARY

In the related art, an m-plane semiconductor element has higher contact resistance than a c-plane semiconductor element, which is a problem.

An embodiment of the present disclosure provides a nitride-based semiconductor element, of which the growing plane is an m plane but which can reduce the contact resistance, and also provides a method for fabricating such an element.

In one general aspect, a nitride-based semiconductor element disclosed herein includes: a p-type contact layer, of which the growing plane is an m plane; and an electrode which is arranged on the growing plane of the p-type contact layer. The p-type contact layer is a GaN-based semiconductor layer which has a thickness of 26 nm to 60 nm and which includes oxygen at a concentration that is equal to or higher than Mg concentration of the p-type contact layer. In the p-type contact layer, the number of Ga vacancies is larger than the number of N vacancies.

According to the above aspect, A nitride-based semiconductor element can reduce the contact resistance of a p-type contact layer, of which the growing plane is an m plane.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1:
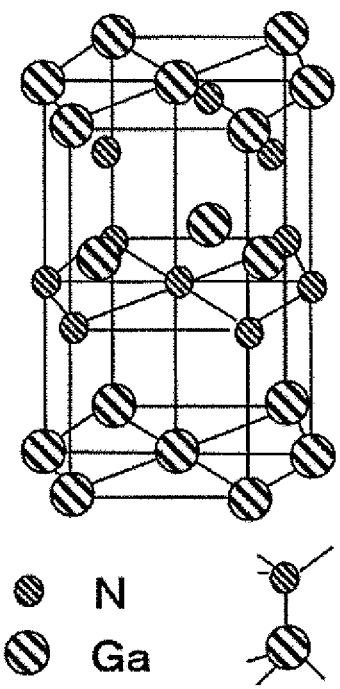
FIG. 1 is a perspective view schematically illustrating a unit cell of GaN.
Figure 2:
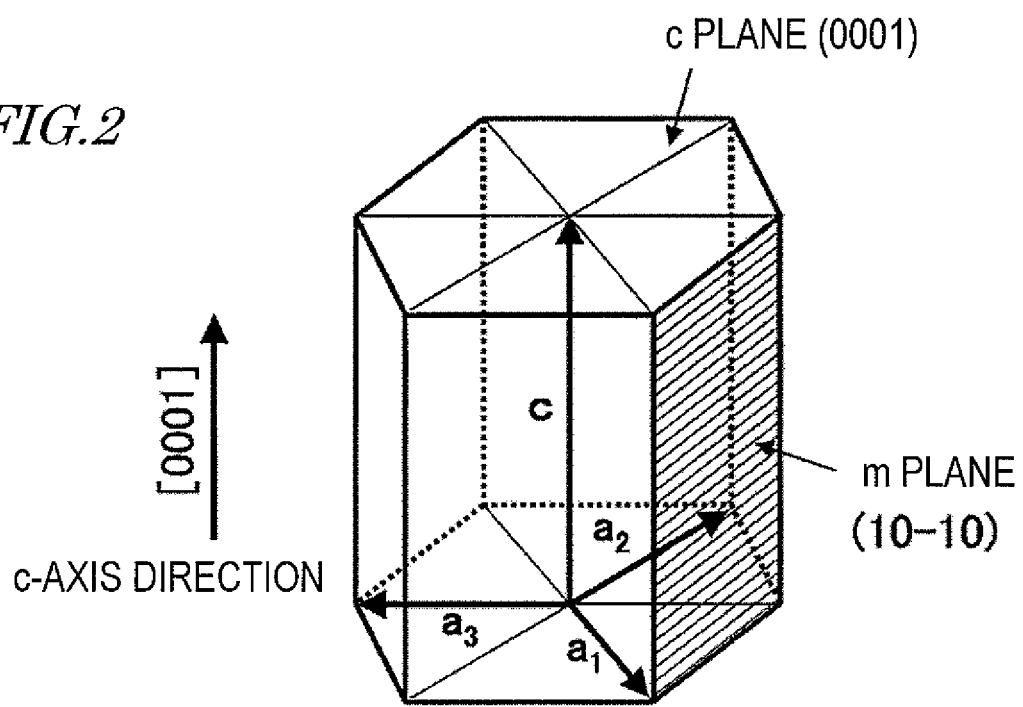
FIG. 2 is a perspective view showing four primitive vectors $a_1$, $a_2$, $a_3$ and c representing a wurtzite crystal structure.

A nitride-based semiconductor element as an embodiment of the present disclosure includes: a p-type contact layer, of which the growing plane is an m plane; and an electrode which is arranged on the growing plane of the p-type contact layer. The p-type contact layer is a GaN-based semiconductor layer which has a thickness of 26 nm to 60 nm and which includes oxygen at a concentration that is equal to or higher than Mg concentration of the p-type contact layer. In the p-type contact layer, the number of Ga vacancies is larger than the number of N vacancies.

In one embodiment, the p-type contact layer is an $Al_xGa_yIn_zN$ (where $x+y+z=1$, $x\geq0$, $y>0$, and $z\geq0$) semiconductor layer.

In one embodiment, the p-type contact layer has a thickness of 30 nm to 45 nm.

In one embodiment, the p-type contact layer includes Mg at a concentration of $4\times10^{19}$ cm$^{-3}$ to $2\times10^{20}$ cm$^{-3}$.

In one embodiment, the nitride-based semiconductor element comprises an Mg-precipitated layer on the growing plane of the p-type contact layer.

In one embodiment, the p-type contact layer includes oxygen at a concentration of $4\times10^{20}$ cm$^{-3}$ or less.

In one embodiment, the electrode includes a first layer which contacts with the p-type contact layer, and the first layer includes at least one of Mg, Zn and Ag.

In one embodiment, the electrode includes a first layer which contacts with the p-type contact layer, and the first layer is an Mg layer, a Zn layer or an Ag layer.

In one embodiment, the electrode includes a first layer which contacts with the p-type contact layer, and the first layer is an alloy layer including at least two of Mg, Zn and Ag.

In one embodiment, the electrode includes an alloy layer which has been formed on the first layer, and the alloy layer is made of an alloy including Mg and at least one of Ag, Pt, Mo and Pd.

In one embodiment, the electrode includes a metal layer which has been formed on either the first layer or the alloy layer.

In one embodiment, the metal layer is made of at least one metal selected from the group consisting of Ag, Pt, Mo and Pd.

In one embodiment, the first layer is a single continuous film.

In one embodiment, the first layer is comprised of a plurality of separate portions.

In one embodiment, the nitride-based semiconductor element further includes a p-type semiconductor region in addition to the p-type contact layer. The p-type semiconductor region has a thickness of 100 nm to 500 nm and includes Mg at a concentration of $1\times10^{18}$ cm$^{-3}$ to $1\times10^{19}$ cm$^{-3}$.

A light source as an embodiment of the present disclosure includes: a nitride-based semiconductor element according to any of the embodiments described above; and a wavelength changing section which includes a phosphor that changes the wavelength of light emitted from the nitride-based semiconductor element.

A method for fabricating a nitride-based semiconductor element according to an embodiment of the present disclosure includes the steps of: (a) providing a substrate; (b) forming, on the substrate, a nitride-based semiconductor multilayer structure including a p-type semiconductor region, of which the growing plane is an m plane and which is made of a GaN-based semiconductor; and (c) forming an electrode on the growing plane of the p-type semiconductor region of the semiconductor multilayer structure. The step (b) includes the step (b1) of forming a p-type contact layer as a GaN-based semiconductor layer having a thickness of 26 nm to 60 nm. The step (b1) includes forming the p-type contact layer so that the p-type contact layer includes oxygen at a concentration that is equal to or higher than Mg concentration of the p-type contact layer. In the p-type contact layer, the number of Ga vacancies is larger than the number of N vacancies.

In one embodiment, the step (c) includes the step (c1) of forming a first layer which contacts with the p-type contact layer and which includes at least one of Mg, Zn and Ag.

In one embodiment, the step (c) includes the step (c2) of forming, on the first layer, a metal layer which is made of at least one metal selected from the group consisting of Ag, Pt, No and Pd.

In one embodiment, the step (c) includes, after the step (c2), the step (c3) of subjecting the first layer and the metal layer to a heat treatment. In the step (c3), Ga atoms diffuse from the p-type semiconductor region toward the electrode but N atoms hardly diffuse from the p-type semiconductor region toward the electrode.

In one embodiment, the step (b1) includes forming an Mg-precipitated layer on the growing plane of the p-type contact layer.

Hereinafter, embodiments of the present disclosure will be described in further detail with reference to the accompanying drawings. Tn the following description, any pair of components shown in multiple drawings and having substantially the same function will be identified herein by the same reference numeral. It should be noted that the present disclosure is in no way limited to the illustrative embodiments to be described below.

Figure 3A:
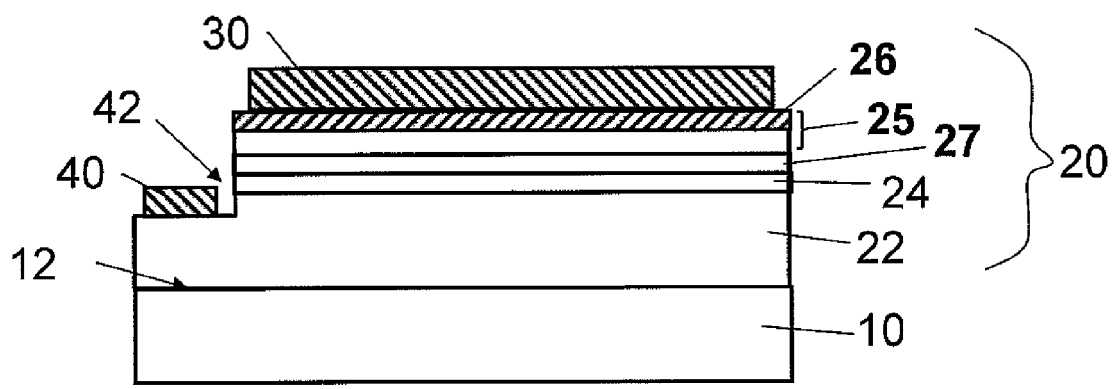
FIG. 3A is a schematic cross-sectional view illustrating a nitride-based semiconductor light-emitting element 100 as an exemplary first embodiment.

FIG. 3A schematically illustrates the cross-sectional structure of a nitride-based semiconductor light-emitting element 100 as an embodiment of the present disclosure. The nitride-based semiconductor light-emitting element 100 illustrated in FIG. 3A is a semiconductor device made of GaN-based semiconductors and has a nitride-based semiconductor multilayer structure.

The nitride-based semiconductor light-emitting element 100 of this embodiment includes a GaN-based substrate 10, of which the principal surface 12 is an m plane, a semiconductor multilayer structure 20 that has been formed on the GaN-based substrate 10, and an electrode 30 arranged on the semiconductor multilayer structure 20. In this embodiment, the semiconductor multilayer structure 20 is an m-plane semiconductor multilayer structure that has been formed through an m-plane growing process and its growing plane is an m plane. It should be noted, however, that a-plane GaN could grow on an r-plane sapphire substrate in some instances. That is why according to the growth conditions, the principal surface of the GaN-based substrate 10 does not always have to be an m plane. In the semiconductor multilayer structure 20 having the configuration of this embodiment, at least the growing plane of its p-type semiconductor region that contacts with an electrode needs to be an m plane.

The nitride-based semiconductor light-emitting element 100 of this embodiment includes the GaN-based substrate 10 to support the semiconductor multilayer structure 20. However, the element 100 may have any other substrate instead of the GaN-based substrate 10 and could also be used without the substrate.

Figure 3B:
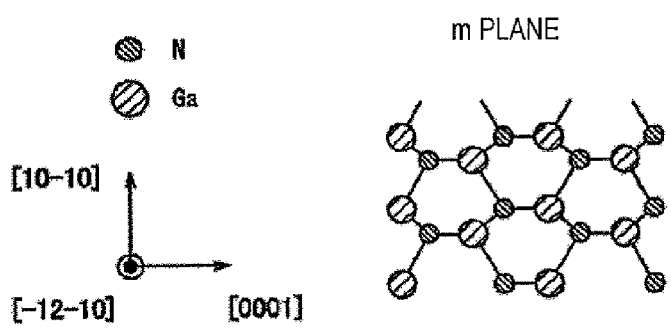
FIG. 3B is a diagram illustrating the crystal structures of an m plane.

FIG. 3B schematically illustrates the crystal structure of a nitride-based semiconductor, of which the growing plane is an m plane, as viewed on a cross section thereof that intersects with the principal surface of the substrate at right angles. Since Ga atoms and nitrogen atoms are present on the same atomic plane that is parallel to the m plane, no electrical polarization will be produced perpendicularly to the m plane. That is to say, the m plane is a non-polar plane and no piezoelectric field will be produced in an active layer that grows perpendicularly to the m plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m plane.

Such a GaN-based substrate, of which the principal surface is an m plane, will be referred to herein as an "m-plane GaN-based substrate". To obtain an m-plane nitride-based semiconductor multilayer structure that has grown perpendicularly to the m plane, typically such an m-plane GaN-based substrate may be used and semiconductors may be grown on the m plane of that substrate. This is because the crystallographic plane orientation of the semiconductor multilayer structure becomes identical with that of the principal surface of the GaN-based substrate. However, the principal surface of the substrate does not always have to be an m plane as described above, and the device as a final product may already have had its substrate removed.

Figure 3C:
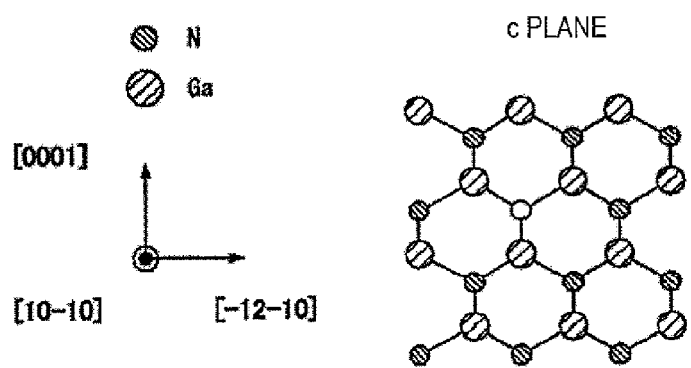
FIG. 3C is a diagram illustrating the crystal structures of a c plane.

The crystal structure of a nitride-based semiconductor, of which the growing plane is a c plane, as viewed on a cross section thereof that intersects with the principal surface of the substrate right angles is illustrated schematically in FIG. 3C just for your reference. In this case, Ga atoms and nitrogen atoms are not present on the same atomic plane that is parallel to the c plane, and therefore, electrical polarization will be produced perpendicularly to the c plane. Such a GaN-based substrate, of which the principal surface is a c plane, will be referred to herein as a "c-plane GaN-based substrate".

A c-plane GaN-based substrate is generally used to grow GaN-based semiconductor crystals thereon. In such a substrate, a Ga atom layer and a nitrogen atom layer that extend parallel to the c plane are slightly shifted from each other in the c-axis direction, and therefore, electrical polarization will be produced in the c-axis direction.

Now look at FIG. 3A again. On the principal surface (that is an m plane) 12 of the m-plane GaN-based substrate 10, the semiconductor multilayer structure 20 has been formed. The semiconductor multilayer structure 20 includes an active layer 24 including an $Al_aIn_bGa_cN$ layer (where $a+b+c=1$, $a \geq 0$, $b \geq 0$ and $c \geq 0$), and an $Al_{x1}In_{y1}Ga_{z1}N$ layer (where $x1+y1+z1=1$, $x1 \geq 0$, $y1 \geq 0$ and $z1 > 0$) 25, which includes an $Al_{x2}In_{y2}Ga_{z2}N$ contact layer (where $x2+y2+z2=1$, $x2 \geq 0$, $y2 \geq 0$ and $z2 > 0$). The $Al_{x1}In_{y1}Ga_{z1}N$ layer (where $x1+y1+z1=1$, $x1 \geq 0$, $y1 \geq 0$ and $z1 > 0$) may be an $Al_dGa_eN$ layer (where $d+e=1$, $d \geq 0$ and $e > 0$) and the $Al_{x2}In_{y2}Ga_{z2}N$ contact layer (where $x2+y2+z2=1$, $x2 \geq 0$, $y2 \geq 0$ and $z2 > 0$) may be a p-$Al_dGa_eN$ contact layer 26, for example.

The $Al_dGa_eN$ layer 25 is located on the other side of the active layer 24 opposite from the principal surface 12 of the GaN-based substrate 10. In this case, the active layer is an electron injection region of the nitride-based semiconductor light-emitting element 100.

The active layer 24 of this embodiment has a GaInN/GaN multiple quantum well (MQW) structure (which has a thickness of 81 nm, for example) in which $Ga_{0.9}In_{0.1}$ well layers (having a thickness of 9 nm, for example) and GaN barrier layers (having a thickness of 9 nm, for example) are stacked alternately one upon the other.

On the active layer 24, stacked is a p-type $Al_dGa_eN$ layer 25, which may have a thickness of 0.2 to 2 µm, for example. Optionally, an undoped GaN layer 27 may be inserted between the active layer 24 and the $Al_dGa_eN$ layer 25.

The semiconductor multilayer structure 20 of this embodiment has other layers, one of which is an $Al_uGa_vIn_wN$ layer (where $u+v+w=1$, $u \geq 0$, $v \geq 0$ and $w \geq 0$) 22 that is arranged between the active layer 24 and the substrate 10. The $Al_uGa_vIn_wN$ layer 22 of this embodiment has first conductivity type, which may be n-type, for example.

In the $Al_dGa_eN$ layer 25, the composition ratio d of Al does not have to be uniform, but could vary either continuously or stepwise, in the thickness direction. In other words, the $Al_dGa_eN$ layer 25 could have a multilayer structure in which a number of layers having mutually different Al composition ratio d are stacked one upon the other, or could have its dopant concentration varied in the thickness direction.

The p-type $Al_dGa_eN$ layer 25 includes a p-$Al_dGa_eN$ contact layer 26, which is provided closer to the growing plane. The rest of the $Al_dGa_eN$ layer 25, other than the p-$Al_dGa_eN$ contact layer 26, has a thickness of 10 nm to 500 nm, for example, and has an Mg concentration of $1\times10^{18}$ cm$^{-3}$ to $1\times10^{19}$ cm$^{-3}$, for example. The p-$Al_dGa_eN$ contact layer 26 has a higher Mg concentration than the rest of the $Al_dGa_eN$ layer 25 other than the p-$Al_dGa_eN$ contact layer 26. The p-$Al_dGa_eN$ contact layer 26 has a high oxygen concentration. As will be described in detail later, Mg included at a high concentration in the p-$Al_dGa_eN$ contact layer 26 effectively contributes to promoting the diffusion of Ga. If the rest of the $Al_dGa_eN$ layer 25 other than the p-$Al_dGa_eN$ contact layer 26 has a thickness of 100 nm to 500 nm, diffusion of Mg toward the active layer 24 can be suppressed, even if Mg is included at a high concentration in the p-$Al_dGa_eN$ contact layer 26. The p-$Al_dGa_eN$ contact layer 26 suitably has an Mg concentration of $4\times10^{19}$ cm$^{-3}$ to $2\times10^{20}$ cm$^{-3}$, and more suitably has an Mg concentration of $1\times10^{20}$ cm$^{-3}$ or less.

It should be noted that the "thickness" of the p-$Al_dGa_eN$ contact layer 26 is defined to be the thickness of a portion of the p-$Al_dGa_eN$ layer 25 in which the Mg concentration falls within the range of $4\times10^{19}$ cm$^{-3}$ to $2\times10^{20}$ cm$^{-3}$.

The p-$Al_dGa_eN$ contact layer 26 suitably has a thickness of 26 nm to 60 nm and more suitably has a thickness of 30 nm to 45 nm. The reason is as follows. By setting the thickness of the p-$Al_dGa_eN$ contact layer 26 to be 26 nm or more, the contact resistance can be decreased sufficiently. Also, by setting the thickness of the p-$Al_dGa_eN$ contact layer 26 to be 30 nm or more, the contact resistance can be further decreased. On the other hand, by setting the thickness of the p-$Al_dGa_eN$ contact layer 26 to be 60 nm or less, increase in the bulk resistance of the $Al_dGa_eN$ contact layer 26 can be checked. Also, by setting the thickness of the p-$Al_dGa_eN$ contact layer 6 to be 45 nm or less, the bulk resistance can be further reduced.

By setting both of the Mg concentration and thickness of the p-$Al_dGa_eN$ contact layer 26 within these ranges, the contact resistance can be decreased sufficiently. The dopant concentration and thickness of the p-$Al_dGa_eN$ contact layer 26 will be described in detail later by reference to results of measurements.

To reduce the contact resistance, the p-$Al_dGa_eN$ contact layer 26 may be a layer that has an Al composition ratio d of zero (i.e., a GaN layer). However, the Al composition ratio d does not have to be zero. Alternatively, an $Al_{0.05}Ga_{0.95}N$ layer, of which the Al composition ratio d is approximately 0.05, could also be used as the p-$Al_dGa_eN$ contact layer 26.

An electrode 30 has been formed on the semiconductor multilayer structure 20. The electrode 30 of this embodiment includes an Mg layer 32 and an Ag layer 34 which has been formed on the Mg layer 32. In the electrode 30, the Mg layer 32 is in contact with the p-$Al_dGa_eN$ contact layer 26 of the semiconductor multilayer structure 20 and functions as a portion of a p-side electrode.

In the electrode 30, the Mg layer 32 and the Ag layer 34 may be alloyed together at least partially. That is to say, only a boundary portion between the Mg and Ag layers 32 and 34 may be alloyed together or the entire electrode 30 may be an alloy of Mg and Ag.

Figure 4A:
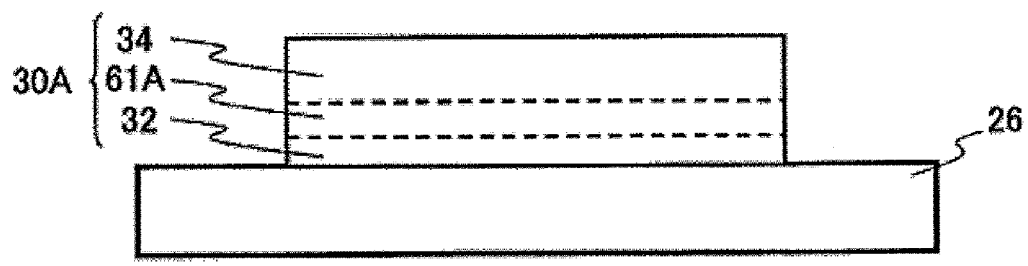
FIGS. 4A through 4C are diagrams schematically illustrating three different distributions of Mg and Ag in an electrode.
Figure 4B:
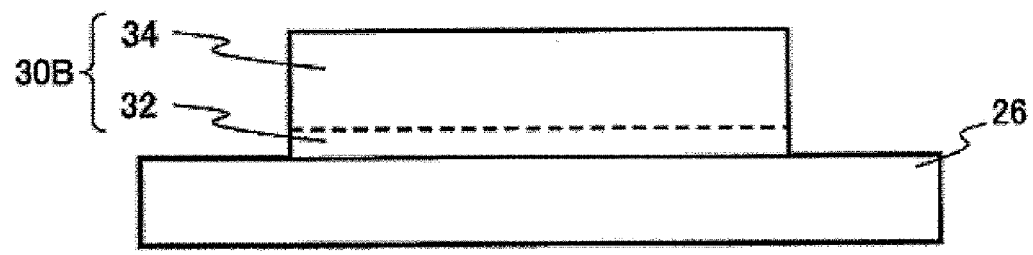
Figure 4C:
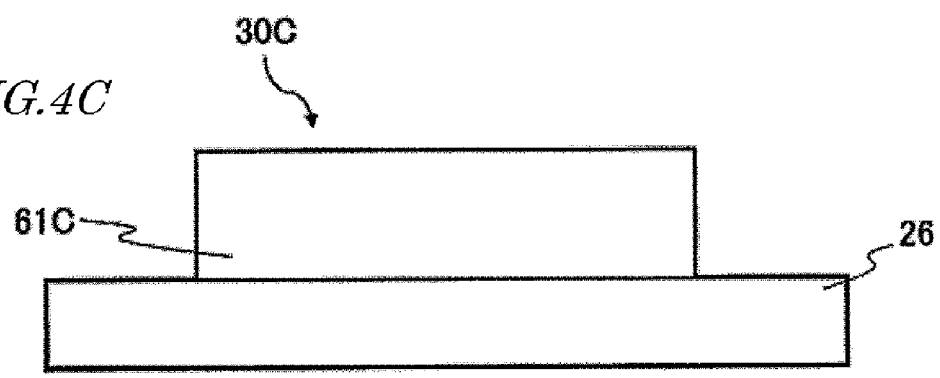

FIGS. 4A through 4C illustrate how to make an alloy between the Mg layer 32 and the Ag layer 34. Specifically, FIG. 4A illustrates a situation where the Mg and Ag layers 32 and 34 have been partially alloyed together. In this case, the electrode 30A is made up of an Mg layer 32 which contacts with the p-$Al_dGa_eN$ contact layer 26, an Mg—Ag alloy layer 61 which is located on the Mg layer 32, and an Ag layer 34 which is located on the Mg—Ag alloy layer 61A as shown in FIG. 4A.

FIG. 4B illustrates a situation where Mg and Ag have been alloyed together to the point of reaching the p-$Al_dGa_eN$ contact layer 26. In the state shown in FIG. 4B, the Mg layer 32 of the electrode 30B (i.e., a portion of the electrode 30B that contacts with the p-$Al_dGa_eN$ contact layer 26) is made of an Mg—Ag alloy. In the exemplary electrode 30B shown in FIG. 4B, there is an Ag layer 34 over such an Mg layer 32.

FIG. 4C illustrates an electrode 30C in which Mg and Ag layers have been completely alloyed together. In this case, the electrode 30C consists of only an Mg—Ag alloy layer 61C.

The Mg—Ag alloy shown in FIGS. 4A through 4C is made essentially of Mg and Ag (i.e., its main components are Mg and Ag). The structures shown in FIGS. 4A through 4C can be formed by stacking an Ag layer on an Mg layer and then subjecting the stack to a heat treatment. Optionally, the structure shown in FIG. 4C may be formed by performing an evaporation process using a mixture or compound of Mg and Ag as an evaporation source and then subjecting it to a heat treatment.

The Ag layer 34 may be an alloy which is made essentially of Ag but which includes a very small amount of other additive metal(s) such as Cu, Au, Pd, Nd, Sm, Sn, In or Bi. The Ag layer 34 that has been alloyed with any of these metals is superior to Ag in terms of thermal resistance and reliability.

On each of these electrodes 30A, 308 and 30C, an electrode layer or interconnect layer made of any other metal or alloy may be formed separately from the Mg and Ag layers 32 and 34.

It should be noted that the Mg layer 32 may be cohered at least partially through the heat treatment after those layers have been stacked to form a plurality of separate portions. That is to say, the Mg layer 32 may be made up of a plurality of portions that are spaced apart from each other on the growing plane of the p-$Al_dGa_eN$ contact layer 26. In that case, Ag that makes the Ag layer 34 fills the gaps between a plurality of separate portions of the Mg layer 32. The Ag layer 34 may also be cohered at least partially to form a plurality of separate portions.

In this embodiment, the electrode 30 may have a thickness of 10 nm to 200 nm, for example. In the electrode 30, the Mg layer 32 may have a thickness of 2 nm to 45 nm, for example. It should be noted that the thickness of the Mg layer 32 is that of the Mg layer 32 that has gone through the heat treatment.

The Ag layer 34 may have a thickness of 200 nm or less (or 10 nm to 200 nm), for example. The Mg layer 32 may be thinner than the Ag layer 34. By making the Mg layer 32 thinner than the Ag layer 34, it is possible to prevent the Mg layer 32 from peeling off from the p-$Al_dGa_eN$ contact layer 26 due to loss of strain balance between the Mg layer 32 and the Ag layer 34.

In this first embodiment, the electrode 30 is made up of the Mg layer 32 (first layer) which contacts with the p-$Al_dGa_eN$ contact layer 26 and the Ag layer 34 (second layer) which has been stacked on the Mg layer 32. Alternatively, the first layer may be made of Zn. Still alternatively, the first layer may be an alloy of Mg and Zn or an alloy of Mg or Zn and any other metal.

The second layer may be made of a metal other than Ag (such as Pt, Pd or Mo). Also, the electrode 30 does not have to be a stack of first and second layers but may also consist of a single layer.

The GaN based substrate 10, of which the principal surface 12 is an m plane, may have a thickness of 100 μm to 400 μm, for example. This thickness is recommended because there will be no trouble handling a wafer if its thickness is approximately 100 μm or more. It should be noted that the substrate 10 of this embodiment does not have to have a multilayer structure, as long as its principal surface 12 is an m plane made of a GaN based material. That is to say, the GaN based substrate 10 of this embodiment is a substrate, at least the principal surface 12 of which is an m plane. Thus, the substrate may naturally be made of a GaN based material in its entirety or may also be made of a combination of a GaN based material and any other material.

In the configuration of this embodiment, the electrode 40 (i.e., n-side electrode) is arranged on a part of the n-type $Al_uGa_vIn_wN$ layer 22 (having a thickness of 0.2 to 2 μm, for example) on the substrate 10. In the illustrated example, in a region of the semiconductor multilayer structure 20 where the electrode 40 is arranged, a recess 42 has been formed so as to expose a part of the n-type $Al_uGa_vIn_wN$ layer 22. The electrode 40 is arranged on the surface of that n-type $Al_uGa_vIn_wN$ layer 22 that is exposed in the recess 42. The electrode 40 may be a stack of Ti, Al and Ag layers and may have a thickness of 100 nm to 200 nm, for example.

Figure 5:
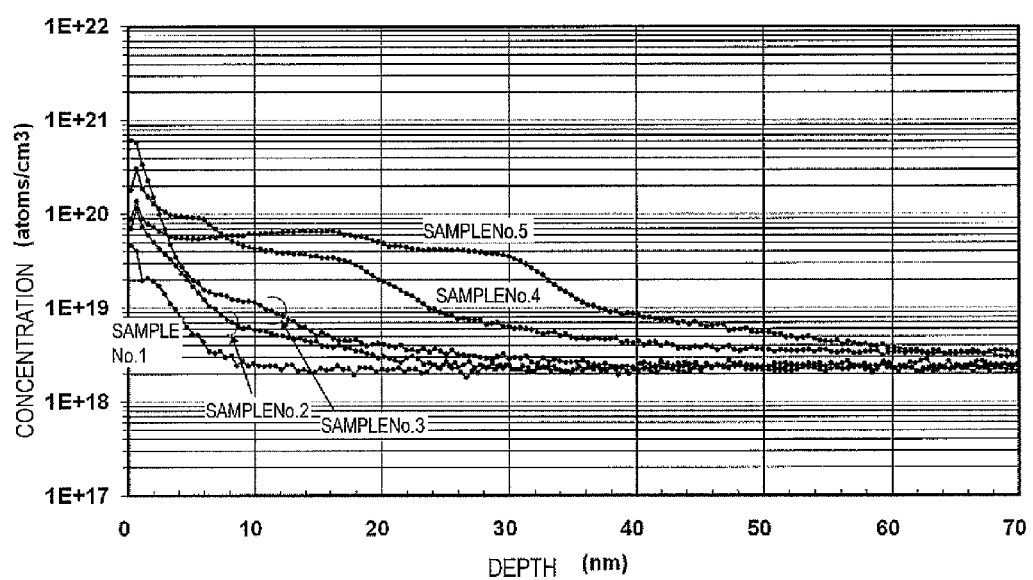
FIG. 5 is a graph showing depth direction profiles of Mg in a p-GaN contact layer 26 which were obtained using a SIMS (Secondary Ion-microprobe Mass Spectrometer) with respect to Samples Nos. 1 through 5 (in which the electrode had not been formed yet).

FIG. 5 shows the depth direction profiles of Mg atoms in the $Al_dGa_eN$ layer 25 including the p-$Al_dGa_eN$ contact layer 26. These profiles were obtained using a SIMS. The origin (0 μm) on the axis of abscissas substantially corresponds to the growing plane of the p-$Al_dGa_eN$ contact layer 26. The "+" range on the axis of abscissas indicates a region of the p-$Al_d$-$Ga_eN$ contact layer 26 which is located closer to the substrate than its growing plane is. In this case, the larger the numerical value of the abscissa, the deeper the level represented by that numerical value. As for the ordinates, on the other hand, "1.0E+17" means "$1 \times 10^{17}$" and "1.0E+18" means "$1 \times 10^{18}$". That is to say, "1.0E+X" means "$1 \times 10^x$".

The results of measurement shown in FIG. 5 were obtained without forming an electrode on the $Al_dGa_eN$ layer 25. The measurement was carried out in such a state in order to eliminate the influence to be caused by forming an electrode.

Sample No. 1 is a sample in which no p-type contact layer 26 was formed in the $Al_dGa_eN$ layer 25. On the other hand, in Samples Nos. 2 to 5, the p-type contact layer 26 started to be formed at respectively different times in the process step of forming the $Al_dGa_eN$ layer 25. In Sample No. 2, the p-type contact layer (having an Mg dopant concentration of $4 \times 10^{19}$ cm$^{-3}$ or more) had a thickness of about 3 nm. In Sample No. 3, the p-type contact layer (having an Mg dopant concentration of $4 \times 10^{19}$ cm$^{-3}$ or more) had a thickness of about 5 nm. In Sample No. 4, the contact layer (having an Mg dopant concentration of $4 \times 10^{19}$ cm$^3$ or more) had a thickness of about 15 nm. And in Sample No. 5, the contact layer (having an Mg dopant concentration of $4 \times 10^{19}$ cm$^{-3}$ or more) had a thickness of about 26 nm.

FIGS. 6A through 6E show the current-voltage characteristics and contact resistances which were measured with an electrode including Mg/Ag layers formed on Samples Nos. 1 through 5 shown in FIG. 5. The contact resistances shown in FIGS. 6A through 6E were evaluated by TLM (transmission line method). Each of the curves representing the current-voltage characteristics shown in FIGS. 6A through 6E is associated with any of the inter-electrode gaps of the TLM electrode pattern shown in FIG. 6F, which illustrates how multiple 100 μm×200 μm electrodes are arranged with gaps of 8 μm, 12 μm, 16 μm and 20 μm left between them. In general, contact resistance is inversely proportional to the area of contact S (cm$^2$). In this case, if the contact resistance is identified by R (Ω), the equation R=Rc/S is satisfied. The constant of proportionality Rc is called "specific contact resistance" and corresponds to contact resistance R when the area of contact S is 1 cm$^2$. That is to say, the magnitude of the specific contact resistance does not depend on the area of contact S and becomes an index for evaluating the contact characteristic. In the following description, the "specific contact resistance" will sometimes be simply referred to herein as "contact resistance".

Figure 6A:
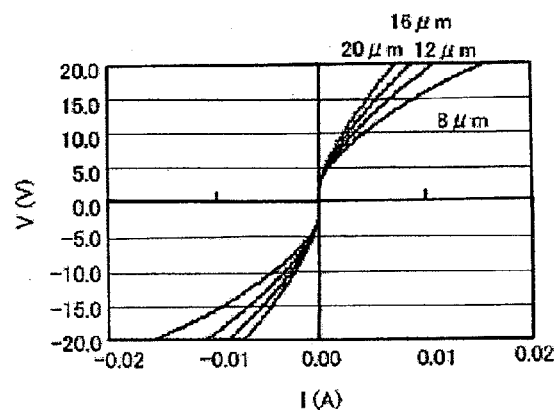
FIG. 6A is a graph showing the current-voltage characteristic and specific contact resistance which were measured in Sample No. 1 shown in FIG. 5.
Figure 6B:
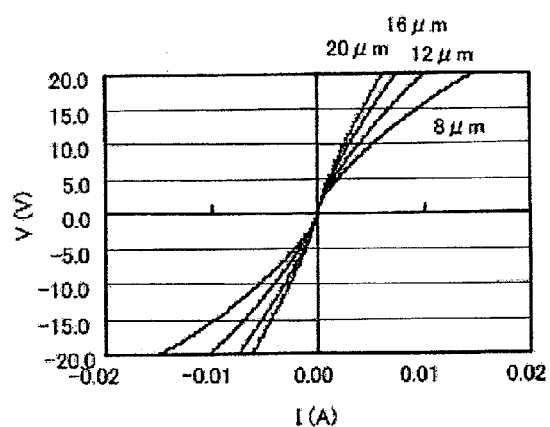
FIG. 6B is a graph showing the current-voltage characteristic and specific contact resistance which were measured in Sample No. 2 shown in FIG. 5.
Figure 6C:
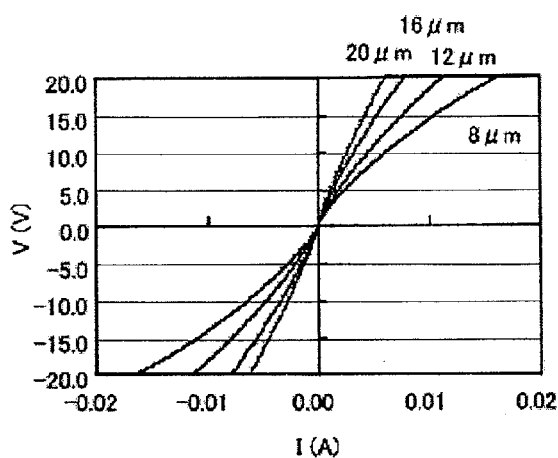
FIG. 6C is a graph showing the current-voltage characteristic and specific contact resistance which were measured in Sample No. 3 shown in FIG. 5.
Figure 6D:
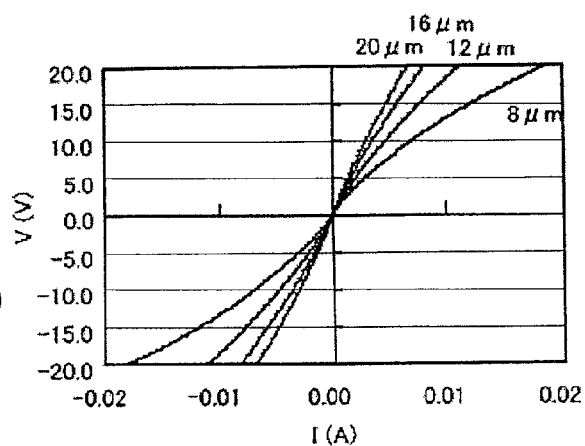
FIG. 6D is a graph showing the current-voltage characteristic and specific contact resistance which were measured in Sample No. 4 shown in FIG. 5.
Figure 6E:
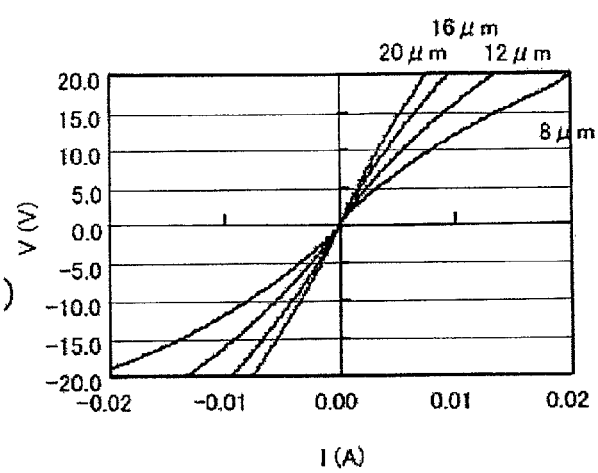
FIG. 6E is a graph showing the current-voltage characteristic and specific contact resistance which were measured in Sample No. 5 shown in FIG. 5.
Figure 6F:
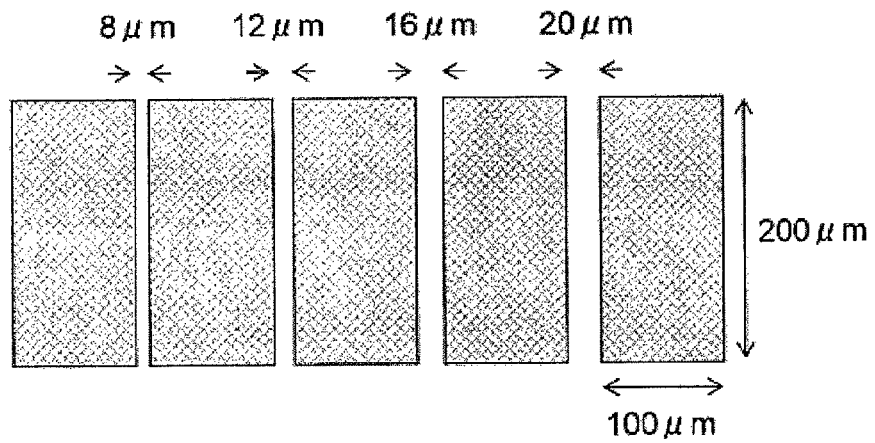
FIG. 6F is a diagram illustrating a pattern for a TLM electrode.

The specific contact resistance of Sample No. 1 including no p-$Al_dGa_eN$ contact layer 26 was $3.7 \times 10^{-2}$ (Ωcm$^2$) as shown in FIG. 6A. The p-$Al_dGa_eN$ contact layer 26 of Samples Nos. 2, 3 and 4 had thicknesses of 3 nm, 5 nm and 15 nm, respectively, and had specific contact resistances of $7.1 \times 10^{-2}$ (Ωcm$^2$), $2.0 \times 10^{-3}$ (Ωcm$^2$) and $1.6 \times 10^{-3}$ (Ωcm$^2$), respectively, as shown in FIGS. 6B through 6D. These results reveal that the thicker the p-$Al_dGa_eN$ contact layer 26 is, the smaller the specific contact resistance tended to be. In Sample No. 5, its p-$Al_dGa_eN$ contact layer 26 had a thickness of 26 nm and its specific contact resistance was $1.1 \times 10^{-3}$ (Ωcm$^2$) as shown in FIG. 6E.

As can be seen from these results, when the p-$Al_dGa_eN$ contact layer 26 (i.e., a region of the $Al_dGa_eN$ layer 25 including dopant Mg at a concentration of $4 \times 10^{19}$ cm$^{-3}$ or more) had a thickness of 26 nm, the specific contact resistance was $1.1 \times 10^{-3}$ Ωcm$^2$. And the thicker the p-$Al_dGa_eN$ contact layer 26 is, the smaller this value is.

The present inventors disclose in PCT International Application Publication No. 2010/113405 that the specific contact resistance can be reduced by forming an electrode including an Mg layer on an m-plane, p-type nitride-based semiconductor layer. As can be seen from the results shown in FIGS. 6A through 6E, by optimizing the Mg concentration profile of the p-$Al_dGa_eN$ contact layer 26 in the configuration in which the Mg layer 32 is in contact with the p-$Al_dGa_eN$ contact layer 26, the contact resistance can be further reduced.

Figure 7:
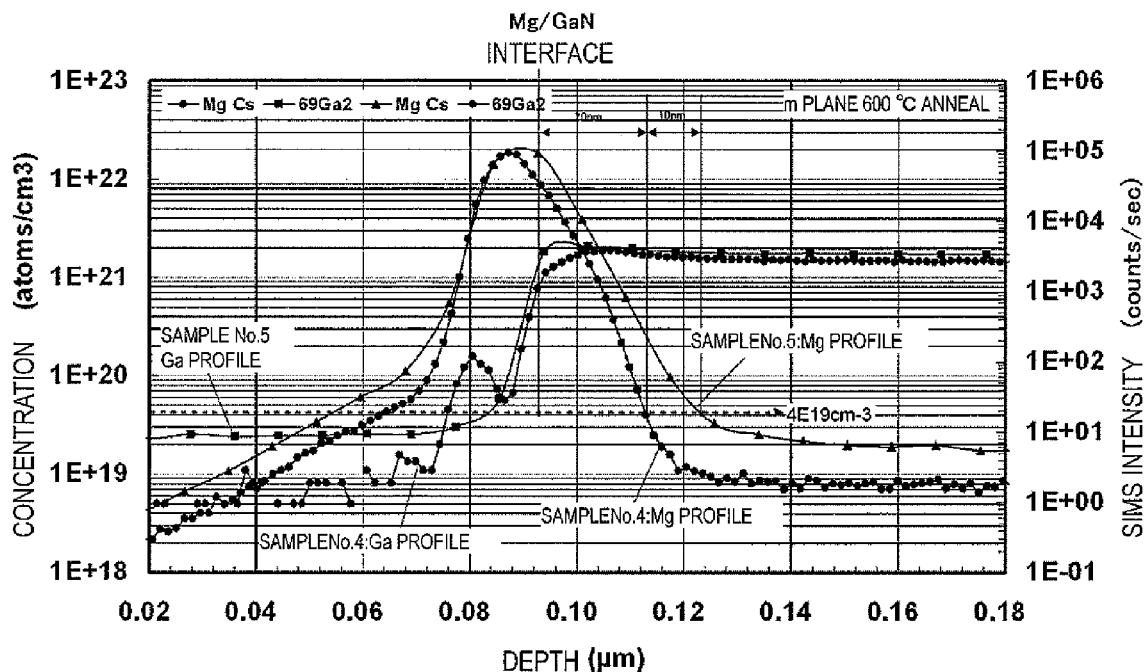
FIG. 7 is a graph showing depth direction profiles of Mg and Ga which were obtained using a SIMS with respect to Samples Nos. 1 through 5 (in which the electrode had already been formed).

FIG. 7 shows the Ga and Mg atom depth direction profiles of samples in which an electrode 30 consisting of Mg/Ag layers was formed on a semiconductor multilayer structure that had been formed by the same method as Samples Nos. 4 and 5 shown in FIG. 5 (the former samples will also be referred to herein as "Samples Nos. 4 and 5" for convenience sake). These concentration profiles were obtained using a SIMS. Before the heat treatment, the Mg and Ag layers of the electrode 30 had thicknesses of 7 nm and 75 nm, respectively. The ordinate of this graph represents the signal intensity detected by a SIMS detector and an atomic concentration which is proportional to the signal intensity. Each of the profiles shown in FIG. 7 was obtained from a sample that was subjected to the heat treatment at 600 degrees Celsius for 10 minutes after the electrode 30 had been formed.

As shown in FIG. 7, a "depth" value of around 0.09 on the axis of abscissas indicates the interface between the Mg layer 32 of the electrode 30 and the p-$Al_dGa_eN$ contact layer 26. A level represented by a larger abscissa value than that of this interface is located in the p-$Al_dGa_eN$ contact layer 26 and a level represented by a smaller abscissa value than that of this interface is located in the electrode 30.

As shown in FIG. 7, the presence of Ga in the electrode 30 was confirmed in both of Samples Nos. 4 and 5. In Sample No. 4, the Ga concentration in the electrode 30 was $1 \times 10^{19}$ cm$^{-3}$ or less. On the other hand, in Sample No. 5, the Ga concentration in the electrode 30 was $2 \times 10^{19}$ cm$^{-3}$ or more. As can be seen, in Sample No. 4, Ga diffused less toward the electrode 30 than in Sample No. 5. Based on this result, the present inventors discovered that Ga would diffuse more as the thickness of the p-$Al_dGa_eN$ contact layer 26 was increased. The results shown in FIGS. 6D and 6E revealed that Sample No. 5 had lower contact resistance than Sample No. 4. Based on these results, it was confirmed that there is a correlation between the concentration of Ga diffused into the electrode 30 and the contact resistance even though the reason is not quite clear.

If Ga atoms diffuse toward the electrode from p-type GaN, then the number of Ga atoms will be insufficient on the growing plane side of p-type GaN. That is to say, Ga vacancies are created there. Such Ga vacancies will act as a sort of acceptors. That is why if the number of Ga vacancies increases in the vicinity of the interface between the electrode and the p-type GaN, then holes will pass through the Schottky barrier of that interface more easily due to a so-called "tunneling" phenomena. In this embodiment, the p-$Al_dGa_eN$ contact layer 26 is made of a GaN-based semiconductor layer having a thickness of 26 nm to 60 nm and including Mg at a concentration of $4 \times 10^{19}$ cm$^{-3}$ to $2 \times 10^{20}$ cm$^{-3}$ and oxygen at a concentration of $1 \times 10^{19}$ cm$^{-3}$ to $4 \times 10^{20}$ cm$^{-3}$. That is to say, the oxygen concentration range of the p-type contact layer covers its Mg concentration range entirely. For that reason, the oxygen concentration of the p-type contact layer is sometimes lower than its Mg concentration and sometimes equal to or higher than its Mg concentration. Optionally, an Mg layer 32 may be provided on the p-$Al_dGa_eN$ contact layer 26. Then, diffusion of Ga would be promoted and the contact resistance would decrease. The principle on which Mg creates Ga vacancies would be the same as what is disclosed in PCT International Application Publication No. 2010/052810.

On the other hand, if not only those Ga atoms but also N atoms diffuse toward the electrode, the number of N atoms will also be insufficient on the growing plane side of the p-type GaN. That is to say, N vacancies will also be created there. Those N vacancies will act like donors and will produce charge compensation between the Ga vacancies and the N vacancies on the growing plane side of the p-type GaN. In addition, as those N atoms are lost, the crystallinity of GaN crystals would deteriorate. That is why if not only Ga atoms but also N atoms diffuse toward the electrode, the contact resistance between the p-type GaN and the electrode will be high. The present inventors confirmed as a result of another set of experiments that N atoms would hardly diffuse toward the electrode according to this embodiment. Such a behavior of those elements would also be observed even if Ga is partially replaced with In in the p-$Al_dGa_eN$ contact layer 26. The results would also be the same even if the first layer of the electrode 30 is made of Zn, an alloy of Mg and Zn, or an alloy of Mg, Zn and any other metal and if the second layer thereof is made of a metal other than Ag.

Hereinafter, it will be described with reference to FIG. 3A once again how to fabricate the nitride-based semiconductor light-emitting element 100 of this embodiment.

First of all, an m-plane substrate 10 is prepared. In this embodiment, a GaN substrate is used as the substrate 10. The GaN substrate of this embodiment is obtained by HVPE (hydride vapor phase epitaxy) method.

For example, a thick GaN film is grown to a thickness of several millimeters on a c-plane sapphire wafer, and then diced perpendicularly to the c plane (i.e., parallel to the m plane) to obtain m-plane GaN substrates. However, the GaN substrate does not have to be prepared by this particular method. Alternatively, an ingot of bulk GaN may be made by some liquid phase growth process such as a Na flux method or some melt growth process such as an ammono-thermal process and then diced parallel to the m-plane.

The substrate 10 does not have to be a GaN substrate but may also be a gallium oxide substrate, an SiC substrate, an Si substrate or a sapphire substrate, for example. To grow an m-plane GaN-based semiconductor on the substrate by epitaxy, it is recommended that the principal surface of the SiC or sapphire substrate be an m plane, too. However, in some instances, a-plane GaN could grow on an r-plane sapphire substrate. That is why according to the growth conditions, the surface on which the crystal growth should take place does not always have to be an m plane. In any case, at least the surface (growing plane) of the semiconductor multilayer structure 20 should be an m plane. In this embodiment, crystal layers are formed one after another on the substrate 10 by MOCVD (metalorganic chemical vapor deposition) method.

Specifically, an $Al_uGa_vIn_wN$ layer 22 is formed on the m-plane GaN substrate 10. As the $Al_uGa_vIn_wN$ layer 22, AlGaN may be deposited to a thickness of 3 µm, for example. An AlGaN layer may be deposited by supplying TMG (Ga(CH$_3$)$_3$), TMA (Al(CH$_3$)$_3$) and NH$_3$ gases onto the m-plane GaN substrate 10 at 1100 degrees Celsius, for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth temperature may be lowered to 800 degrees Celsius, because In can be introduced more efficiently by doing that.

Thereafter, an undoped GaN layer is deposited to a thickness of 30 nm, for example, on the active layer 24, and then an $Al_dGa_eN$ layer 25 is formed on the undoped GaN layer. If p-$Al_{0.14}Ga_{0.86}N$ is deposited to a thickness of 0.5 µm, for example, as the $Al_dGa_eN$ layer 25, TMG, NH$_3$, and TMA gases and Cp$_2$Mg (cyclopentadienyl magnesium) gas as a p-type dopant are supplied at a growth temperature of 950 degrees Celsius.

Next, a p-$Al_dGa_eN$ contact layer 26 is deposited to a thickness of 26 nm, for example, on the $Al_dGa_eN$ layer 25. In this process step, by increasing the flow rate of the Cp$_2$Mg gas supplied, the Mg concentration of the p-$Al_dGa_eN$ contact layer 26 is set to be higher than that of the rest of the $Al_dGa_eN$ layer 25. Also, the concentration of oxygen impurities in the $Al_dGa_eN$ layer 25 is set to fall within the range of $1 \times 10^{19}$ cm$^{-3}$ to $4 \times 10^{20}$ cm$^{-3}$. The concentration of oxygen impurities in the p-$Al_dGa_eN$ contact layer 26 can be controlled by adjusting the concentration of oxygen in NH$_3$ gas, for example. Hereinafter, this respect will be described.

In this embodiment, oxygen as an impurity included in a gas for use to grow the p-$Al_dGa_eN$ layer (e.g., NH$_3$ gas) is used effectively. The present inventors discovered via experiments that an m plane is a crystallographic plane orientation in which oxygen can be introduced easily while a nitride based semiconductor is growing. Thus, the present inventors chose to use that oxygen included in the NH$_3$ gas intentionally by taking advantage of that property. As a result, the present inventors discovered that the concentration of oxygen in the p-$Al_dGa_eN$ layer can be controlled by adjusting the flow rate of the NH$_3$ gas supplied. That is to say, if the flow rate of the NH$_3$ gas supplied is increased, the oxygen concentration in the p-$Al_dGa_eN$ layer can be increased. Conversely, if the flow rate of the NH$_3$ gas supplied is decreased, the oxygen concentration in the p-$Al_dGa_eN$ layer can be decreased.

It should be noted that oxygen is also included as an impurity in Cp$_2$Mg which is an Mg source gas. That is why the oxygen concentration may be controlled by adjusting not only the flow rate of the NH$_3$ gas but also the flow rate of the Cp$_2$Mg gas as well. However, since Cp$_2$Mg is an Mg source gas, the concentration of Mg in the p-$Al_dGa_eN$ layer naturally changes if the flow rate of Cp$_2$Mg is increased. However, the respective concentrations of Mg and oxygen can be controlled independently of each other by adjusting the flow rate of a Ga source gas that determines the growth rate of a p-type layer in addition to the flow rates of those gases. Optionally, the oxygen concentration can also be changed by adjusting process parameter such as a growth temperature or a gas pressure.

It should be noted that if the oxygen concentration in the p-Al$_d$Ga$_e$N layer 25 became excessively high, then the electrical property of the p-Al$_d$Ga$_e$N layer 25 would deteriorate. This is because since oxygen functions as an n-type dopant, an excessively high oxygen concentration in the p-Al$_d$Ga$_e$N layer 25 would reduce effectively Mg that is a p-type dopant. That is why the oxygen concentration in the rest of the p-Al$_d$Ga$_e$N layer 25 other than the p-Al$_d$Ga$_e$N contact layer 26 is set to be lower than the oxygen concentration in the p-Al$_d$Ga$_e$N contact layer 26, and may be set to fall within the range of $1 \times 10^{17}$ cm$^{-3}$ to $1 \times 10^{18}$ cm$^{-3}$, for example.

If a GaN layer having an Mg concentration of $4 \times 10^{19}$ cm$^{-3}$ needs to be deposited to a thickness of 26 nm as the p-Al$_d$Ga$_e$N contact layer 26, then TMG, NH$_3$ and Cp$_2$Mg gases may be supplied at flow rates of 8 sccm, 7.5 slm and 400 sccm, respectively, with the growth temperature maintained at 950 degrees Celsius, for example. If the ratio of the flow rate of the Mg source gas to the overall flow rate of the source gases (including crystal and impurity source gases) is 5% or more, then the dopant concentration in the p-Al$_d$Ga$_e$N contact layer 26 can be $4 \times 10^{18}$ cm$^{-3}$ or more.

The growth temperature of the p-Al$_d$Ga$_e$N contact layer 26 may be set to be within the range of 900 degrees Celsius to 1000 degrees Celsius. By setting the growth temperature to be 900 degrees Celsius or more, decline in crystallinity due to a decrease in growth rate can be reduced. Also, by setting the growth temperature to be 1000 degrees Celsius or less, surface roughening due to desorption of nitrogen can be reduced.

Thereafter, respective portions of the p-GaN contact layer, the Al$_d$Ga$_e$N layer 25, the undoped GaN layer, and the active layer 24 are removed by performing a chlorine-based dry etching process to make a recess 42 and expose a region of the Al$_x$Ga$_y$In$_e$N layer 22 where an n-side electrode will be formed. Then, Ti/Pt layers are deposited as an n-side electrode 40 on the region reserved for an n-side type electrode at the bottom of the recess 42.

Subsequently, an Mg layer 32 is formed on the p-Al$_d$Ga$_e$N contact layer 26 and then an Ag layer 34 is stacked on the Mg layer 32. In this manner, a p-side electrode 30 is formed.

The Mg layer 32 is suitably formed by pulse evaporation in order to form a dense film of quality, but may also be formed by thermal CVD or molecular beam epitaxy (MBE) method as well. On the other hand, the Ag layer 34 may be formed by ordinary evaporation, for example.

Thereafter, a heat treatment is carried out at 600 degrees Celsius for 10 minutes.

When the temperature of the heat treatment that was carried out after the electrode 30 had been formed reached and exceeded 500 degrees Celsius, the contact resistance decreased steeply. When the temperature reached 600 degrees Celsius, the contact resistance further decreased. And when the temperature was further raised to 700 degrees Celsius, the contact resistance was higher than when the temperature was 600 degrees Celsius but was still lower than an ordinary value. The heat treatment temperature may be set to be 500 degrees Celsius or more, for example. Also, by setting the heat treatment temperature to be 700 degrees Celsius or less, deterioration in the film quality of the electrode or the GaN layer can be reduced (see PCT International Application Publication No. 2010/113405).

Optionally, the substrate 10 and a portion of the Al$_u$Ga$_v$In$_w$N layer 22 could be removed after that by some technique such as laser lift-off, etching or polishing. In that case, either only the substrate 10 or the substrate 10 and a portion of the Al$_u$Ga$_v$In$_w$N layer 22 could be removed selectively. It is naturally possible to leave the substrate 10 and the Al$_u$Ga$_v$In$_w$N layer 22 as they are without removing them. By performing these process steps, the nitride-based semiconductor light-emitting element 100 of this embodiment is completed.

In the nitride-based semiconductor light-emitting element 100 of this embodiment, when a voltage is applied to between the n- and p-side electrodes 40 and 30, holes are injected from the p-side electrode 30 into the active layer 24 and electrons are injected from the n-side electrode 40 into the active layer 24. As a result, the holes and electrons are recombined in the active layer to emit light having a wavelength of 450 nm, for example.

If Mg is included at a concentration of $4 \times 10^{19}$ cm$^{-3}$ or more in a p-type nitride-based compound semiconductor layer, of which the growing plane is a c plane, contact resistance between the p-type nitride-based compound semiconductor layer and the electrode increases due to an increase in resistance in the layer. In addition, in the case of the c-plane growth, Mg does not promote the diffusion of Ga so effectively. Thus, as for such a p-type nitride-based compound semiconductor layer, of which the growing plane is a c plane, it would be beneficial to make the p-type nitride-based compound semiconductor layer as thin as possible (e.g., to a thickness of about 10 nm) in order to reduce the resistance in the layer. In the p-Al$_d$Ga$_e$N contact layer 26 of this embodiment, of which the growing plane is an m plane, as the concentration of Mg rises, the resistance in the layer increases but the contact resistance decreases.

The present inventors confirmed that in the case of a c-plane nitride-based semiconductor light-emitting element (comparative example) which was made under the same condition as this embodiment except that the light-emitting element was made by c-plane growth, the contact resistance between the p-type nitride-based semiconductor layer (c-plane) and the Mg/Ag electrode was approximately $8.0 \times 10^{-3}$ $\Omega$cm$^2$, which is higher than the contact resistance in the case of the m-plane growth. This is probably because in the c-plane nitride-based semiconductor light-emitting element, not only Ga atoms but also N atoms will diffuse toward the Mg/Ag electrode.

Embodiment 2

Hereinafter, a nitride-based semiconductor light-emitting element according to a second embodiment of the present disclosure will be described with reference to the accompanying drawings. In the following description, any pair of components shown in multiple drawings and having substantially the same function will be identified herein by the same reference numeral. It should be noted that the present disclosure is in no way limited to the illustrative embodiments to be described below.

Figure 8:
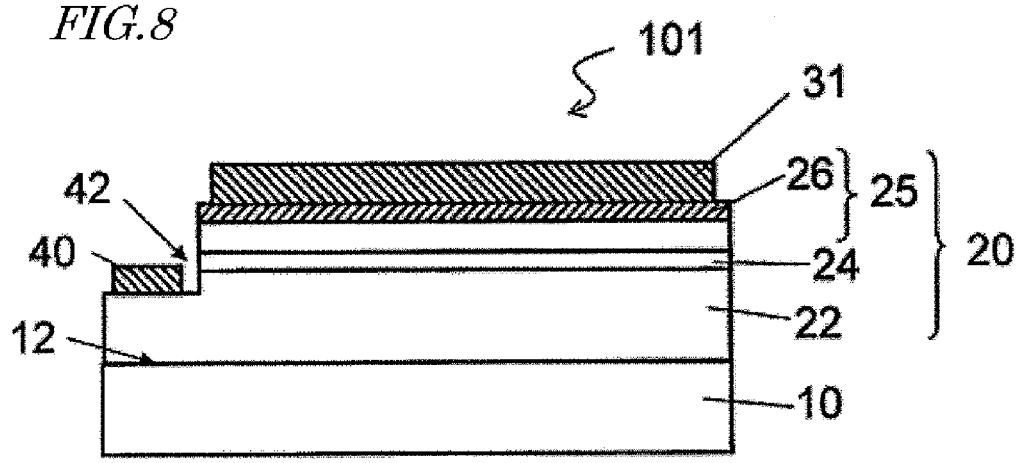
FIG. 8 is a schematic cross-sectional view of a nitride-based semiconductor light-emitting element 101 as an exemplary second embodiment.

FIG. 8 schematically illustrates a cross-sectional structure of a nitride-based semiconductor light-emitting element 101 according to this second embodiment. In the nitride-based semiconductor light-emitting element 101 shown in FIG. 8, the electrode 31 consists essentially of an Ag layer alone. In the other respects, however, the nitride-based semiconductor light-emitting element 101 of this embodiment has the same configuration as the nitride-based semiconductor light-emitting element 100 of the first embodiment, and description thereof will be omitted herein.

The Ag layer of the electrode 31 may have a thickness of 100 nm to 500 nm, for example. The Ag layer may be an alloy which is made essentially of Ag but which includes a very small amount of other additive metal(s) such as Cu, Au, Pd, Nd, Sm, Sn, In or Bi. The Ag layer that has been alloyed with any of these metals is superior to Ag in terms of thermal resistance and reliability.

The present inventors measured the specific contact resistances of samples of this embodiment. The results will be described below. In each of the samples that were subjected to this measurement, the p-Al$_d$Ga$_e$N contact layer 26 had a thickness of 26 nm and Mg included in the p-Al$_d$Ga$_e$N contact layer 26 had the same concentration profile as that of Sample No. 5 shown in FIG. 5. On the p-Al$_d$Ga$_e$N contact layer of this sample, formed was an electrode 31 consisting essentially of an Ag layer having a thickness of 100 nm. The present inventors confirmed that the sample of this embodiment could have a specific contact resistance of $8.0 \times 10^{-4}$ $\Omega cm^2$ to $1.0 \times 10^{-3}$ $\Omega cm^2$. Thus, it was confirmed that the contact resistance could be reduced sufficiently in this embodiment, too.

The present inventors confirmed that if a sample of this embodiment in which the p-Al$_d$Ga$_e$N contact layer 26 had already been formed was left in the air, a layer of magnesium chloride approximately as thin as one atomic layer (0.2 nm) would precipitate on the growing plane of the p-Al$_d$Ga$_e$N contact layer 26. That magnesium chloride would have been produced through precipitation of Mg in the p-Al$_d$Ga$_e$N contact layer 26 on the growing plane side of the p-Al$_d$Ga$_e$N contact layer 26 at as high a temperature as about 950 degrees Celsius (i.e., the temperature at which the p-Al$_d$Ga$_e$N contact layer 26 is grown epitaxially) and reaction of that Mg layer to chlorine. Another possibility would be a phenomenon that Mg included in the atmosphere in the furnace is deposited on the growing plane side of the p-Al$_d$Ga$_e$N contact layer 26. It should be noted that it is difficult to observe such an Mg-precipitated layer as thin as one atomic layer using a SIMS.

The thickness and shape of the Mg-precipitated layer vary according to the concentration of Mg included in the p-Al$_d$Ga$_e$N contact layer 26, the thickness of the p-Al$_d$Ga$_e$N contact layer 26, and the condition of heat treatment to carry out after the electrode 31 has been formed. The Mg-precipitated layer may be either a layer including Mg as its main component or an alloy of Mg and a metal of the electrode 31. Also, the Mg-precipitated layer may include Ga in the semiconductor multilayer structure 20. The Mg-precipitated layer does not always have to form a layer but may also be made up of a plurality of separate portions.

In this embodiment, by carrying out heat treatment after the electrode 31 has been formed with the Mg-precipitated layer present, Ga would move from the p-Al$_d$Ga$_e$N contact layer 26 into the electrode 31, which would create Ga vacancies in the p-Al$_d$Ga$_e$N contact layer 26. And almost no N atoms should move toward the electrode 31. The contact resistance would decrease based on such a principle. Even in a c-plane nitride-based semiconductor light-emitting element (representing a comparative example) that has been formed under the same condition as this embodiment except that the element is made by c-plane growth, such an Mg-precipitated layer could be present. Even so, not only Ga atoms but also N atoms would diffuse toward the Ag electrode simultaneously as a result of the heat treatment described above. Consequently, in the c-plane nitride-based semiconductor light-emitting element (representing a comparative example), higher contact resistance would be obtained than in this embodiment (m-plane).

The manufacturing process of this embodiment is the same as that of the first embodiment except that an Ag layer is formed as the electrode 31. The Ag layer may be formed by an ordinary evaporation process, for example.

In this embodiment, the p-Al$_d$Ga$_e$N contact layer 26 has a dopant concentration of $4 \times 10^{19}$ cm$^{-3}$ to $2 \times 10^{20}$ cm$^{-3}$ and a thickness of 26 nm to 60 nm, and includes oxygen as an impurity, and therefore, the contact resistance can be reduced sufficiently.

On top of that, the light emitted from the active layer 24 can be reflected from the electrode 31 at a higher reflectance. Since Ag reflects light at high reflectance, it is recommended that the distance from the growing plane of the p-Al$_d$Ga$_e$N contact layer 26 to the Ag layer in the electrode 31 be short, considering reflection of light. Although the Mg layer 32 is interposed between the Ag layer 34 in the electrode 31 and the p-Al$_d$Ga$_e$N contact layer 26 in the first embodiment, the distance from the Ag layer in the electrode 31 to the p-Al$_d$Ga$_e$N contact layer 26 can be shortened according to this embodiment by the thickness of the Mg layer 32 of the first embodiment. As a result, the reflectance of light from the active layer 24 can be increased compared to the first embodiment.

In this embodiment, the electrode 31 consists essentially of an Ag layer. The surface of the electrode 31 may be covered with a protective electrode made of any metal (such as Ti, Pt, Mo, Pd, Au or W) other than Ag. Alternatively, to protect the electrode 31, a protective layer made of a dielectric material (such as SiO$_2$ or SiN) may also be formed. And interconnect metal (such as Au or AuSn) may be deposited on the protective electrode or the protective layer. The electrode 31 may be made of any metal (such as Pt, Pd, or Mo) other than Ag or two or more kinds of alloys. Alternatively, the electrode 31 may be made up of multiple layers.

Embodiment 3

Hereinafter, a nitride-based semiconductor light-emitting element according to a third embodiment of the present disclosure will be described with reference to FIG. 8. The Ag layer of the electrode 31 may have a thickness of 100 nm to 500 nm, for example. The Ag layer may be an alloy which is made essentially of Ag but which includes a very small amount of other additive metal(s) such as Cu, Au, Pd, Nd, Sm, Sn, In or Bi. The Ag layer that has been alloyed with any of these metals is superior to Ag in terms of thermal resistance and reliability.

The present inventors measured the specific contact resistances of samples of this embodiment. The results will be described below. In each of the samples that were subjected to this measurement, the p-Al$_d$Ga$_e$N contact layer 26 had a thickness of 26 nm and Mg included in the p-Al$_d$Ga$_e$N contact layer 26 had the same concentration profile as that of Sample No. 5 shown in FIG. 5. On the p-Al$_d$Ga$_e$N contact layer of this sample, formed was an electrode 31 consisting essentially of an Ag layer having a thickness of 100 nm. Furthermore, the oxygen impurity concentration was set to be $1 \times 10^{19}$ cm$^{-3}$ or more.

The present inventors confirmed that the sample of this embodiment could have a specific contact resistance of $3.0 \times 10^{-4}$ $\Omega cm^2$. Such low contact resistance has never been achieved in the world as far as the present inventors know.

Figure 9:
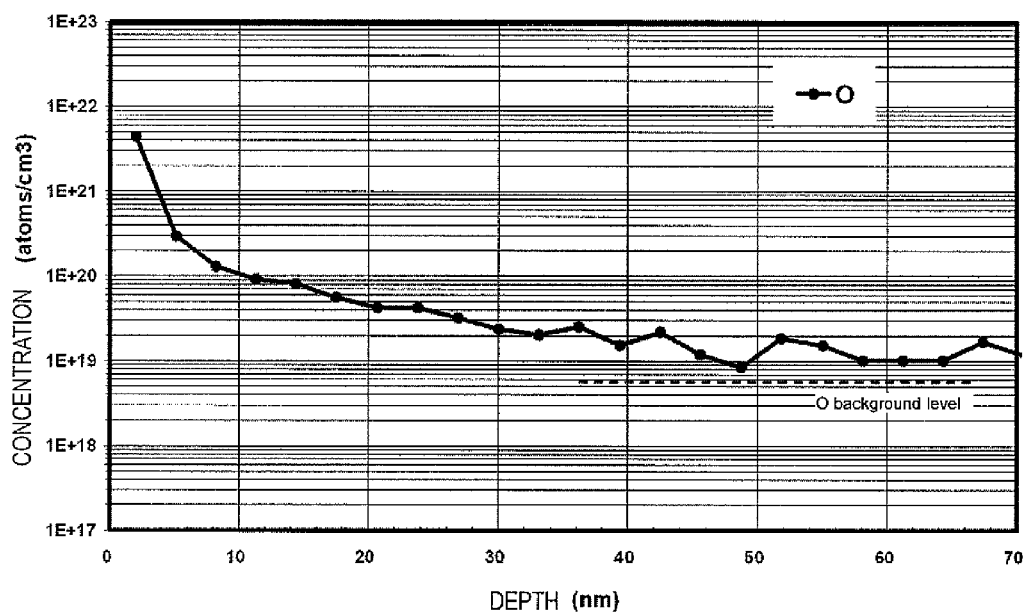
FIG. 9 is a graph showing depth direction profiles of oxygen in the p-GaN contact layer 26 which were obtained using a SIMS (Secondary Ion-microprobe Mass Spectrometer) before the electrode was formed.

FIG. 9 shows the depth direction profiles of oxygen atoms in the Al$_d$Ga$_e$N layer 25 including the p-Al$_d$Ga$_e$N contact layer 26. These profiles were obtained with a SIMS. The origin (0 μm) on the axis of abscissas substantially corresponds to the growing plane of the p-Al$_d$Ga$_e$N contact layer 26. The "+" range on the axis of abscissas indicates a region of the p-Al$_d$Ga$_e$N contact layer 26 which is located closer to the substrate than its growing plane is. In this case, the larger the numerical value of the abscissa, the deeper the level represented by that numerical value. As for the ordinates, on the other hand, "1.0E+17" means "$1\times10^{17}$" and "1.0E+18" means "$1\times10^{18}$". That is to say, "1.0E+X" means "$1\times10^{X}$".

The results of measurement shown in FIG. 9 were obtained without forming an electrode on the AlGaN layer 25. The measurement was carried out in such a state in order to eliminate the influence to be caused by forming an electrode. The contact layer (having an oxygen impurity concentration of $1\times10^{19}$ cm$^{-3}$ or more) had a thickness of approximately 30 nm.

Figure 10A:
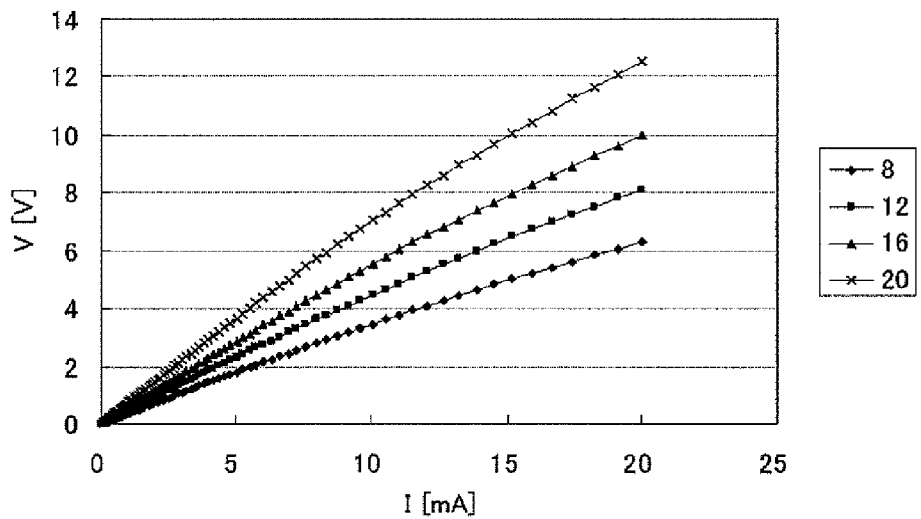
FIG. 10A is a graph showing the current-voltage characteristic associated with the oxygen profile shown in FIG. 9 which were measured using the Mg profile of Sample No. 5 shown in FIG. 5.
Figure 10B:
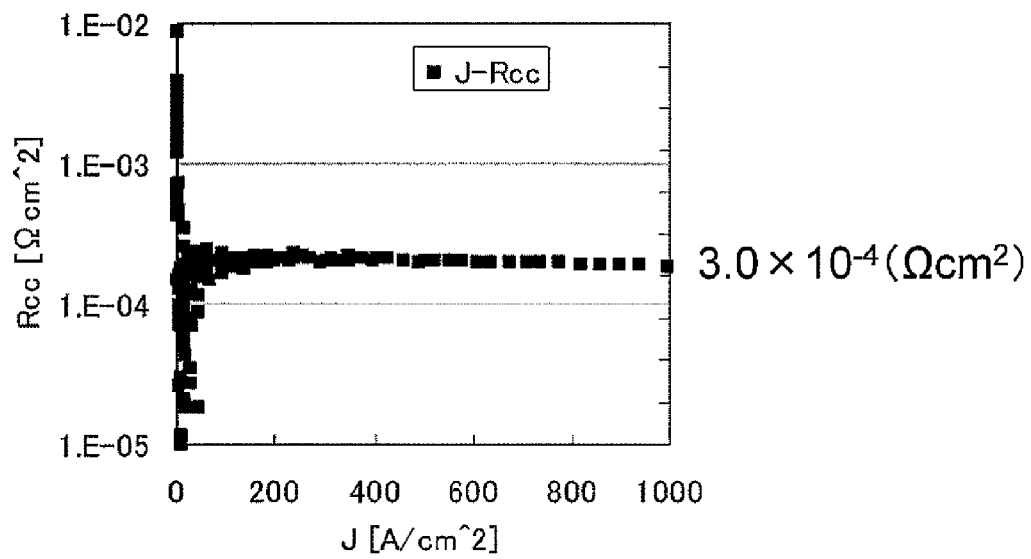
FIG. 10B is a graph showing specific contact resistance associated with the oxygen profile shown in FIG. 9 which were measured using the Mg profile of Sample No. 5 shown in FIG. 5.

FIGS. 10A and 10B show the current-voltage characteristics and contact resistances which were measured with an electrode including Mg/Ag layers formed on a contact layer, of which the Mg dopant concentration profile was the same as that of Sample No. 5 shown in FIG. 5 and the oxygen impurity concentration profile was the same as what is shown in FIG. 9. The contact resistances shown in FIG. 10B were evaluated by TLM (transmission line method). Each of the curves representing the current-voltage characteristics shown in FIG. 10A is associated with any of the inter-electrode gaps of the TLM electrode pattern shown in FIG. 6F. On the p-Al$_d$Ga$_e$N contact layer 26 of this sample, formed was an electrode 31 consisting essentially of an Ag layer having a thickness of 100 nm. The present inventors confirmed that the sample of this embodiment could have a specific contact resistance of $3.0\times10^{-4}$ $\Omega$cm$^2$.

Other Embodiments

The light-emitting element of the embodiment of the present disclosure described above may be used as a light source as it is. However, when combined with a resin including a phosphor to change the wavelength, for example, the light-emitting element of this embodiment can be used effectively as a light source having a broadened wavelength range (e.g., as a white light source).

Figure 11:
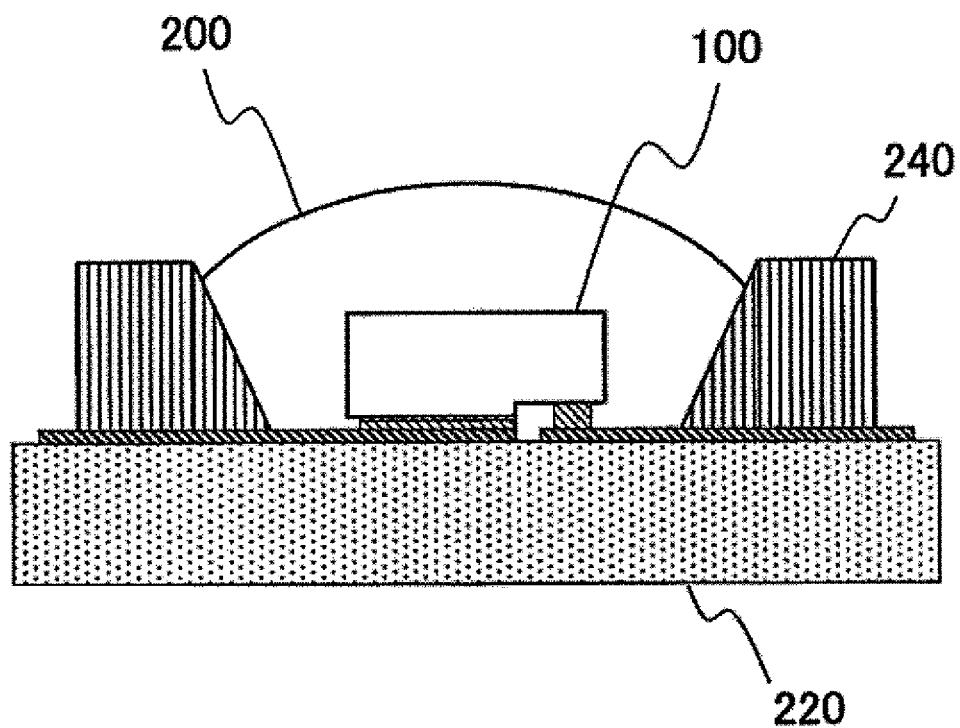
FIG. 11 is a cross-sectional view illustrating an exemplary embodiment of a white light source.

FIG. 11 is a schematic representation illustrating an example of such a white light source. The light source shown in FIG. 11 includes the light-emitting element 100 having the configuration shown in FIG. 3A and a resin layer 200 in which a phosphor (such as YAG (yttrium aluminum garnet)) to change the wavelength of the light emitted from the light-emitting element 100 into a longer wavelength is dispersed. The light-emitting element 100 has been mounted on a supporting member 220 on which an interconnect pattern has been formed. And on the supporting member 220, a reflective member 240 is arranged so as to surround the light-emitting element 100. The resin layer 200 is arranged to cover the light-emitting element 100.

In the foregoing description, the p-type semiconductor region that contacts with the electrode 30 is supposed to be made of GaN or AlGaN. However, the p-type semiconductor region may also be a layer including In such as InGaN. In that case, the contact layer to contact with the electrode 30 may be made of In$_{0.2}$Ga$_{0.8}$N having an In composition ratio of 0.2, for example. If In is included in GaN, the bandgap of Al$_a$Ga$_b$N layer (where a b=1, a≥0 and b>0) can be smaller than that of GaN. Therefore, the contact resistance can be reduced as a result. Consequently, the p-type semiconductor region (i.e., the p-Al$_d$Ga$_e$N contact layer 26) that contacts with the electrode 30 may be made of a GaN-based semiconductor, which is typically represented as Al$_x$Ga$_y$In$_z$N (where x+y+z=1, x≥0, y>0 and z≥0). Optionally, the light-emitting element 101 shown in FIG. 8 may be used in the white light source shown in FIG. 11.

The effect of reducing the contact resistance can naturally be achieved by a non-LED light-emitting element (such as a semiconductor laser diode) or a device other than a light-emitting element (such as a transistor or a photodiode) as well.

It should be noted that the growing plane or the principal surface of an actual m-plane semiconductor layer does not always have to be perfectly parallel to an m plane but may define a predetermined tilt angle with respect to an m plane. The tilt angle is defined by the angle that is formed between a normal line to the actual growing plane of the nitride based semiconductor layer and a normal line to the m plane (which is an m plane that is not tilted). The actual growing plane may tilt in any of vector directions that are represented by the c- and a-axis directions with respect to the m plane (that is not tilted). The absolute value of the tilt angle θ may be 5 degrees or less, and is suitably 1 degree or less, in the c-axis direction, and may be 5 degrees or less, and is suitably 1 degree or less, in the a-axis direction, too. That is to say, according to the present disclosure, the "m plane" includes a plane that defines a tilt angle of ±5 degrees or less in a predetermined direction with respect to the m plane (that is not tilted). If the tilt angle falls within such a range, then the growing plane of the nitride-based semiconductor is tilted overall with respect to the m plane. However, the former plane should actually include a huge number of m-plane regions exposed, speaking microscopically. That is why planes that are tilted at an angle of 5 degrees or less (which is the absolute value) with respect to an m plane would have similar properties to those of the m plane. However, if the absolute value of the tilt angle θ were more than 5 degrees, the internal quantum efficiency could decrease due to a piezoelectric field. For that reason, the absolute value of the tilt angle θ is set to be 5 degrees or less.

In the first and second embodiments, the Al$_d$Ga$_e$N layer 25 and p-Al$_d$Ga$_e$N contact layer 26 are doped with Mg as a p-type dopant. However, in an embodiment of the present disclosure, Zn, Be or any other p-type dopant may also be added besides Mg.

As described above, in an embodiment of the present disclosure, the electrode arranged on the semiconductor multi-layer structure may include an Mg layer, a Zn layer or an Ag layer. In this case, the Mg, Zn and Ag layers refer herein to layers which include Mg, Zn and Ag, respectively, and in which the concentrations of impurities other than Mg, Zn and Ag are 1 mol % or less with respect to Mg, Zn and Ag. Alternatively, the electrode may include a layer made of an alloy of any two of Mg, Zn and Ag. This semiconductor multilayer structure includes a p-type semiconductor region, of which the principal surface or growing plane is an m plane. If a region in which such an electrode and the growing plane of the p-type semiconductor region contact with each other and which has at least a predetermined thickness includes dopant Mg and impurity oxygen at predetermined concentrations or more, the contact resistance can be reduced.

According to embodiments of the present disclosure, the contact resistance of an m plane semiconductor element can be reduced. Particularly, embodiments of the present disclosure are applicable to a GaN-based semiconductor light-emitting element such as a light-emitting diode or a laser diode that operates at wavelengths over the entire visible radiation range, which covers the ultraviolet, blue, green, orange and white parts of the spectrum. Such a light-emitting element is expected to be applied to various fields of technologies including display, illumination and optical information processing in the near future.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A nitride-based semiconductor element comprising:
   a p-type contact layer, of which the growing plane is an m plane; and
   an electrode which is arranged on the growing plane of the p-type contact layer,
   wherein the p-type contact layer is a GaN-based semiconductor layer which has a thickness of 26 nm to 60 nm and which includes oxygen at a concentration that is equal to or higher than Mg concentration of the p-type contact layer,
   wherein in the p-type contact layer, the number of Ga vacancies is larger than the number of N vacancies, and
   wherein the p-type contact layer includes oxygen at a concentration of $4\times10^{20}$ cm$^{-3}$ or less.

2. The nitride-based semiconductor element of claim 1, wherein the p-type contact layer is an Al$_x$Ga$_y$In$_z$N (where x+y+z=1, x≥0, y>0, and z≥0) semiconductor layer.

3. The nitride-based semiconductor element of claim 1, wherein the p-type contact layer has a thickness of 30 nm to 45 nm.

4. The nitride-based semiconductor element of claim 1, wherein the p-type contact layer includes Mg at a concentration of $4\times10^{19}$ cm$^{-3}$ to $2\times10^{20}$ cm$^{-3}$.

5. The nitride-based semiconductor element of claim 1, comprising an Mg-precipitated layer on the growing plane of the p-type contact layer.

6. The nitride-based semiconductor element of claim 1, wherein the electrode includes a first layer which contacts with the p-type contact layer, and
   wherein the first layer includes at least one of Mg, Zn and Ag.

7. The nitride-based semiconductor element of claim 1, wherein the electrode includes a first layer which contacts with the p-type contact layer, and
   wherein the first layer is an Mg layer, a Zn layer or an Ag layer.

8. The nitride-based semiconductor element of claim 1, wherein the electrode includes a first layer which contacts with the p-type contact layer, and
   wherein the first layer is an alloy layer including at least two of Mg, Zn and Ag.

9. The nitride-based semiconductor element of claim 6, wherein the electrode includes an alloy layer which has been formed on the first layer, and
   wherein the alloy layer is made of an alloy including Mg and at least one of Ag, Pt, Mo and Pd.

10. The nitride-based semiconductor element of claim 6, wherein the electrode includes a metal layer which has been formed on either the first layer or the alloy layer.

11. The nitride-based semiconductor element of claim 10, wherein the metal layer is made of at least one metal selected from the group consisting of Ag, Pt, Mo and Pd.

12. The nitride-based semiconductor element of claim 6, wherein the first layer is a single continuous film.

13. The nitride-based semiconductor element of claim 6, wherein the first layer is comprised of a plurality of separate portions.

14. The nitride-based semiconductor element of claim 1, further comprising a p-type semiconductor region in addition to the p-type contact layer, the p-type semiconductor region having a thickness of 100 nm to 500 nm and including Mg at a concentration of $1\times10^{18}$ cm$^{-3}$ to $1\times10^{19}$ cm$^{-3}$.

15. A light source comprising: the nitride-based semiconductor element of claim 1; and a wavelength changing section which includes a phosphor that changes the wavelength of light emitted from the nitride-based semiconductor element.

16. A nitride-based semiconductor element comprising:
    a p-type contact layer, of which the growing plane is an m plane; and
    an electrode which is arranged on the growing plane of the p-type contact layer,
    wherein the p-type contact layer is a GaN-based semiconductor layer which has a thickness of 26 nm to 60 nm and which includes oxygen at a concentration that is equal to or higher than Mg concentration of the p-type contact layer,
    wherein in the p-type contact layer, the number of Ga vacancies is larger than the number of N vacancies,
    wherein the electrode includes a first layer which contacts with the p-type contact layer, and
    wherein the first layer is an alloy layer including at least two of Mg, Zn and Ag.

17. The nitride-based semiconductor element of claim 16, wherein the p-type contact layer is an Al$_x$Ga$_y$In$_z$N (where x+y+z=1, x≥0, y>0, and z≥0) semiconductor layer.

18. The nitride-based semiconductor element of claim 16, wherein the p-type contact layer has a thickness of 30 nm to 45 nm.

19. The nitride-based semiconductor element of claim 16, wherein the p-type contact layer includes Mg at a concentration of $4\times10^{19}$ cm$^{-3}$ to $2\times10^{20}$ cm$^{-3}$.

20. The nitride-based semiconductor element of claim 16, comprising an Mg-precipitated layer on the growing plane of the p-type contact layer.

21. The nitride-based semiconductor element of claim 16, wherein the electrode includes a metal layer which has been formed on the first layer.

22. The nitride-based semiconductor element of claim 21, wherein the metal layer is made of at least one metal selected from the group consisting of Ag, Pt, Mo and Pd.

23. The nitride-based semiconductor element of claim 16, wherein the first layer is a single continuous film.

24. The nitride-based semiconductor element of claim 16, wherein the first layer is comprised of a plurality of separate portions.

25. The nitride-based semiconductor element of claim 16, further comprising a p-type semiconductor region in addition to the p-type contact layer, the p-type semiconductor region having a thickness of 100 nm to 500 nm and including Mg at a concentration of $1\times10^{18}$ cm$^{-3}$ to $1\times10^{19}$ cm$^{-3}$.

26. A light source comprising: the nitride-based semiconductor element of claim 16; and a wavelength changing section which includes a phosphor that changes the wavelength of light emitted from the nitride-based semiconductor element.

27. A nitride-based semiconductor element comprising:
    a p-type contact layer, of which the growing plane is an m plane; and
    an electrode which is arranged on the growing plane of the p-type contact layer, wherein the p-type contact layer is a GaN-based semiconductor layer which has a thickness of 26 nm to 60 nm and which includes oxygen at a concentration that is equal to or higher than Mg concentration of the p-type contact layer, wherein in the p-type contact layer, the number of Ga vacancies is larger than the number of N vacancies, wherein the electrode includes a first layer which contacts with the p-type contact layer, wherein the first layer includes at least one of Mg, Zn and Ag, and wherein the first layer is comprised of a plurality of separate portions.

28. The nitride-based semiconductor element of claim 27, wherein the p-type contact layer is an $Al_xGa_yIn_zN$ (where $x+y+z=1$, $x\geq0$, $y>0$, and $z\geq0$) semiconductor layer.

29. The nitride-based semiconductor element of claim 27, wherein the p-type contact layer has a thickness of 30 nm to 45 nm.

30. The nitride-based semiconductor element of claim 27, wherein the p-type contact layer includes Mg at a concentration of $4\times10^{19}$ cm$^{-3}$ to $2\times10^{20}$ cm$^{-3}$.

31. The nitride-based semiconductor element of claim 27, comprising an Mg-precipitated layer on the growing plane of the p-type contact layer.

32. The nitride-based semiconductor element of claim 27, wherein the first layer is an Mg layer, a Zn layer or an Ag layer.

33. The nitride-based semiconductor element of claim 27, wherein the electrode includes an alloy layer which has been formed on the first layer, and wherein the alloy layer is made of an alloy including Mg and at least one of Ag, Pt, Mo and Pd.

34. The nitride-based semiconductor element of claim 27, wherein the electrode includes a metal layer which has been formed on either the first layer or the alloy layer.

35. The nitride-based semiconductor element of claim 34, wherein the metal layer is made of at least one metal selected from the group consisting of Ag, Pt, Mo and Pd.

36. The nitride-based semiconductor element of claim 27, further comprising a p-type semiconductor region in addition to the p-type contact layer, the p-type semiconductor region having a thickness of 100 nm to 500 nm and including Mg at a concentration of $1\times10^{18}$ cm$^{-3}$ to $1\times10^{19}$ cm$^{-3}$.

37. A light source comprising: the nitride-based semiconductor element of claim 27; and a wavelength changing section which includes a phosphor that changes the wavelength of light emitted from the nitride-based semiconductor element.

* * * * *